United States Patent
Maruyama et al.

(10) Patent No.: US 7,838,396 B2
(45) Date of Patent: Nov. 23, 2010

(54) BONDING METHOD OF SEMICONDUCTOR SUBSTRATE AND SHEET, AND MANUFACTURING METHOD OF SEMICONDUCTOR CHIPS USING THE SAME

(75) Inventors: Yumi Maruyama, Kariya (JP); Makoto Asai, Kariya (JP)

(73) Assignee: Denso Corporation, Kariya (JP)

( * ) Notice: Subject to any disclaimer, the term of this patent is extended or adjusted under 35 U.S.C. 154(b) by 846 days.

(21) Appl. No.: 11/594,898

(22) Filed: Nov. 9, 2006

(65) Prior Publication Data

US 2007/0111483 A1   May 17, 2007

(30) Foreign Application Priority Data

Nov. 16, 2005   (JP) .............................. 2005-331212
Sep. 12, 2006   (JP) .............................. 2006-246772

(51) Int. Cl.
*H01L 21/00* (2006.01)
(52) U.S. Cl. ................. 438/463; 257/E21.347
(58) Field of Classification Search ................. 438/113, 438/463; 257/79
See application file for complete search history.

(56) References Cited

U.S. PATENT DOCUMENTS

| 5,304,418 | A | 4/1994 | Akada et al. |
| 5,476,565 | A | 12/1995 | Akada et al. |
| 5,824,177 | A * | 10/1998 | Yoshihara et al. ............ 156/250 |
| 7,169,248 | B1 * | 1/2007 | Kirby et al. ................. 156/250 |
| 2005/0026415 | A1 * | 2/2005 | Connell et al. .............. 438/612 |
| 2005/0194364 | A1 * | 9/2005 | Fukuyo et al. ......... 219/121.67 |
| 2005/0202596 | A1 * | 9/2005 | Fukuyo et al. ............... 438/113 |
| 2005/0224959 | A1 * | 10/2005 | Kwon et al. ................. 257/723 |
| 2006/0011593 | A1 | 1/2006 | Fukuyo et al. |
| 2006/0148212 | A1 | 7/2006 | Fukuyo et al. |
| 2006/0197094 | A1 * | 9/2006 | Sugawara ..................... 257/79 |
| 2007/0158314 | A1 | 7/2007 | Fukumitsu et al. |

FOREIGN PATENT DOCUMENTS

| JP | A-2003-218191 | 7/2003 |
| JP | A-2004-349456 | 12/2004 |

OTHER PUBLICATIONS

Office Action dated Feb. 22, 2008 in corresponding German Patent Application No. 10 2006 053 958.3-43 (and English translation).
German Office Action dated Sep. 9, 2009 from the German Patent Office in the corresponding German patent application No. 10 2006 053 958.3-43 (and English translation).

* cited by examiner

*Primary Examiner*—Chandra Chaudhari
(74) *Attorney, Agent, or Firm*—Posz Law Group, PLC

(57) ABSTRACT

A semiconductor substrate is bonded to a joining face of a sheet and is dividable along predetermined dividing lines of the semiconductor substrate by expanding the sheet so as to form semiconductor chips. A bonding layer for bonding a substrate face of the semiconductor substrate and the joining face of the sheet to each other can be formed in each region encircled with the predetermined dividing lines, between the substrate face and the joining face of the sheet. Thus, when the substrate face of the semiconductor substrate and the joining face of the sheet are bonded to each other, the bonding layer does not reach any of the predetermined dividing lines set between the regions. The bonding layer can be formed in dotted segments or a pattern of lattice between the substrate face of the semiconductor substrate and the joining face of the sheet.

19 Claims, 11 Drawing Sheets

BONDING METHOD OF SEMICONDUCTOR SUBSTRATE AND SHEET, AND MANUFACTURING METHOD OF SEMICONDUCTOR CHIPS USING THE SAME

CROSS REFERENCE TO RELATED APPLICATION

This application is based on Japanese Patent Applications No. 2005-331212 filed on Nov. 16, 2005, and No. 2006-246772 filed on Sep. 12, 2006, the contents of which are incorporated herein by reference in its entirety.

FIELD OF THE INVENTION

The present invention relates to a bonding method for bonding a semiconductor substrate and a sheet, which is used when the semiconductor substrate is divided to form semiconductor chips. Furthermore, the present invention relates to a manufacturing method of semiconductor chips divided from a semiconductor substrate.

BACKGROUND OF THE INVENTION

When semiconductor chips are manufactured, lines along which a semiconductor substrate should be divided are processed in the semiconductor substrate by cutting or the like, and the substrate is bonded to a sheet. Furthermore, this sheet is stretched and expanded to apply stress to the semiconductor substrate in the direction of plane, and the substrate is thereby divided into semiconductor chips.

FIGS. 13A and 13B show a conventional manufacturing method of semiconductor chips C. FIG. 13A illustrates a state where a semiconductor substrate W is bonded to an extendable resin sheet S and the peripheral portion of the sheet S is supported by a frame F, and FIG. 13B illustrates a process in which the semiconductor substrate W is divided into the semiconductor chips C with a pushing machine M.

As illustrated in FIG. 13A, the semiconductor substrate W has semiconductor devices D (elements) formed over its substrate face, and lines L along which the substrate should be divided are processed by cutting or the like. Furthermore, a substrate face of the semiconductor substrate W on the back side is bonded to the extensible resin sheet S. A bonding layer B is formed over the entire face of the sheet S to which the semiconductor substrate W is to be bonded by applying ultraviolet curing adhesive or the like. The entire substrate face of the semiconductor substrate W on the back side is bonded to the bonding layer B. The peripheral portion of the sheet S is supported by the annular frame F.

As illustrated in FIG. 13B, the pushing machine M that is placed beneath the semiconductor substrate W and is moved up/down by a moving unit, not shown, is used to press the semiconductor substrate W from the back side of the sheet S so that it is plunged up. Thus, the sheet S is stretched in the direction of plane (the directions indicated by arrows F1 and F2 in the drawing). As a result, stress is applied to the semiconductor substrate W bonded to the sheet S in the direction of plane, and the semiconductor substrate W is divided into multiple semiconductor chips C (JP-A-2004-349456).

However, the conventional method for manufacturing semiconductor chips involves a problem. The stretch of the sheet S is restricted by the bonding layer B in the vicinity of lines L along which the substrate should be divided, and sufficient force cannot be sometimes applied to the lines L along which the substrate should be divided. That is, a semiconductor substrate W is not accurately divided, like the portion indicated by symbol X, and this lowers the yield of semiconductor chips C.

As indicated by symbol Y, powder from the bonding layer B expanded in conjunction with the stretch of the sheet S can fly in all directions when the semiconductor substrate W is divided, and it can stick to semiconductor devices D.

SUMMARY OF THE INVENTION

In view of the foregoing problems, it is a first object of the present invention to provide a bonding method for bonding a semiconductor substrate and a sheet, which improves the yield of semiconductor chips formed by dividing the semiconductor substrate, and can prevent powder caused from a bonding layer from sticking to semiconductor devices when the semiconductor substrate is divided.

It is another object of the present invention to provide a manufacturing method of semiconductor chips from a semiconductor substrate.

According to an example of the present invention, in a semiconductor substrate that is made to be bonded to a joining face of a sheet and is dividable along predetermined dividing lines of the semiconductor substrate by expanding the sheet so as to form semiconductor chips, a bonding layer is formed for bonding a substrate face of the semiconductor substrate and the joining face of the sheet to each other in each region encircled with the predetermined dividing lines, between the substrate face and the joining face of the sheet. In this case, the bonding layer is formed such that, when the substrate face of the semiconductor substrate and the joining face of the sheet are bonded to each other, the bonding layer does not reach any of the predetermined dividing lines set between the regions.

Accordingly, when the substrate face of the semiconductor substrate and the joining face of the sheet are bonded to each other, the bonding layer does not exist on the predetermined dividing lines. Therefore, the bonding layer does not arrest and restrict the stretch of the sheet in the vicinity of predetermined dividing lines. As a result, the semiconductor substrate can be divided into semiconductor chips without fail, and the yield of semiconductor chips can be enhanced. Since force required to expand the sheet is reduced, the bonding layer is not torn off or stripped off. Further, since no bonding layer exists on the predetermined dividing lines, powder from the bonding layer expanded in conjunction with the expansion of the sheet does not fly in all directions or stick to semiconductor devices when the semiconductor substrate is divided.

Alternatively, the bonding layer can be formed in dotted segments scattered between the substrate face of the semiconductor substrate and the joining face of the sheet. Since the dotted segments of the bonding layer are scattered between the substrate face and the joining face of the sheet, a quantity of adhesive used for forming the bonding layer can be reduced.

Alternatively, the bonding layer can be formed in a pattern of lattice in which strips intersect one another along the joining face of the sheet, except for portions where strips of the bonding layer and any of the predetermined dividing lines overlap with each other.

Furthermore, the bonding layer may be formed on the joining face of the sheet. In this case, the semiconductor substrate and the sheet can be easily bonded to each other just by placing the prepared substrate on the sheet and applying pressure. Alternatively, the bonding layer may be formed on the substrate face of the semiconductor substrate. In this case, the bonding layer can be precisely formed in position relative to the predetermined dividing lines. Therefore, there is no possibility that a superfluous segment of the bonding layer exists on the predetermined dividing lines due to displacement.

In addition, the joining face of the sheet may have recess portions recessed in the direction of its thickness, and the bonding layer may be formed in the recess portions. In this case, even when the joining face of the sheet is pressed with the semiconductor substrate to bond the semiconductor substrate and the sheet to each other, the bonding layer does not extend in the direction of the plane of the semiconductor substrate and does not reach the predetermined dividing lines.

According to an example of a manufacturing method of semiconductor chips of the present invention, a bonding layer is formed for bonding a substrate face of a semiconductor substrate and a joining face of a sheet to each other at plural positions partially between the substrate face and the joining face of the sheet, a laser head that projects laser light along the predetermined dividing lines for dividing the semiconductor substrate is moved to apply the laser light from a side of the semiconductor substrate so that a light-converging point is positioned within the semiconductor substrate to form a modified region due to multiphoton absorption at the light-converging point, and the sheet is expanded thereby dividing the semiconductor substrate along the predetermined dividing lines with the modified region taken as a starting point to form the semiconductor chips. Furthermore, in the manufacturing method, the modified region is formed except for any of the predetermined dividing lines.

Accordingly, this manufacturing method can improve the yield of semiconductor chips formed by dividing the semiconductor substrate, and can reduce powder caused from the bonding layer from sticking to semiconductor devices when the semiconductor substrate is divided.

BRIEF DESCRIPTION OF THE DRAWINGS

Additional objects and advantages of the present invention will be more readily apparent from the following detailed description of preferred embodiments when taken together with the accompanying drawings.

DETAILED DESCRIPTION OF PREFERRED EMBODIMENTS

First Embodiment

Description will be given to a bonding method for a semiconductor substrate and a sheet in the first embodiment of the invention with reference to drawings.

Figure 1A:
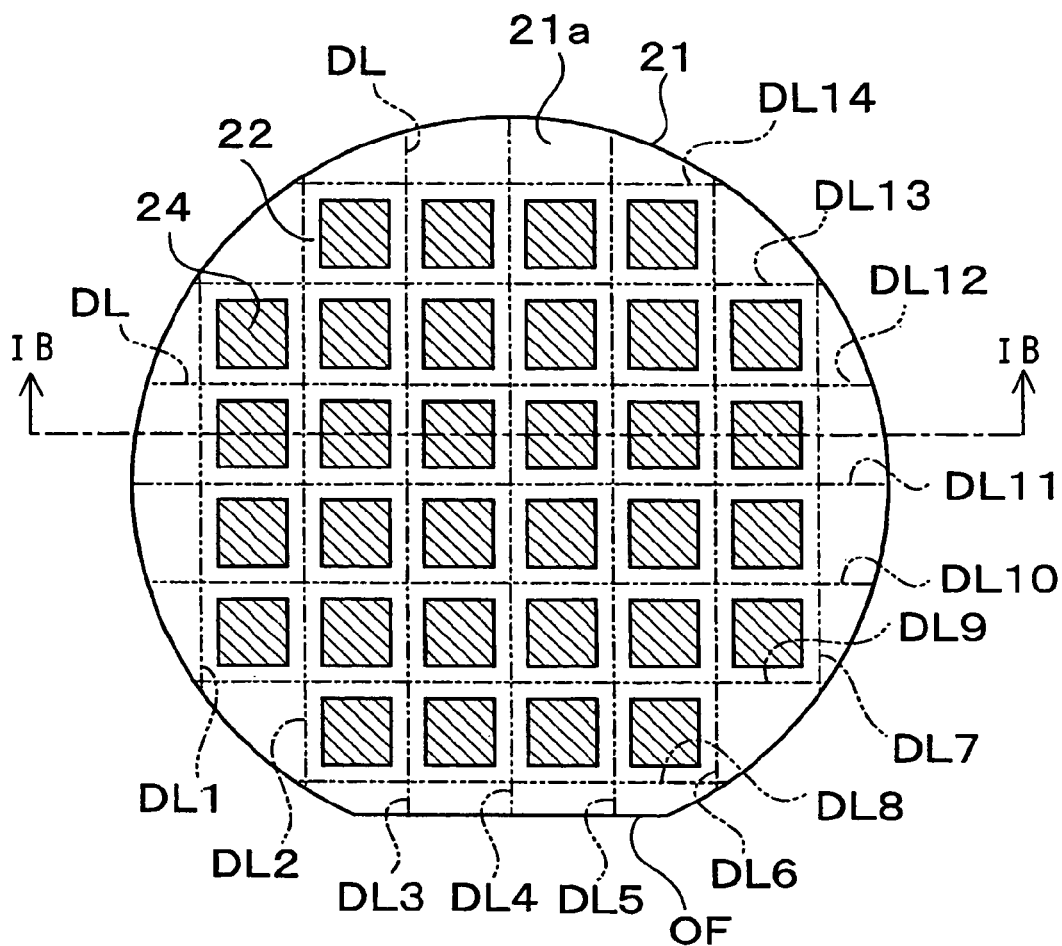
FIG. 1A is a plan view of a semiconductor substrate.
Figure 1B:
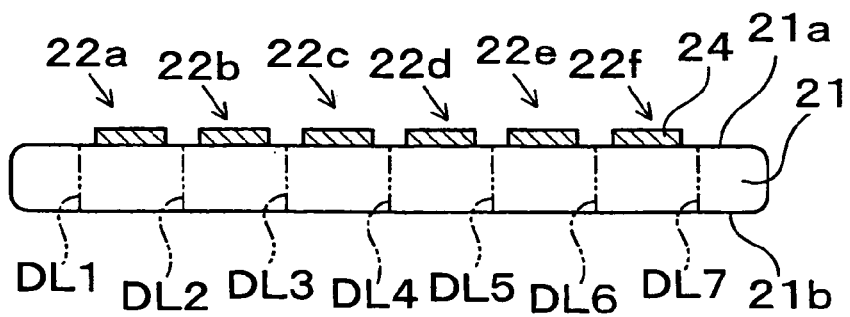
FIG. 1B is a sectional view taken along line IB-IB of FIG. 1A.

FIG. 1A is a plan view of a semiconductor substrate 21, and FIG. 1B is a sectional view taken along line IB-IB of FIG. 1A. Here, the structure of the semiconductor substrate 21 is described. First, a thin-plate, disk-shaped semiconductor substrate 21 formed of silicon as illustrated in FIG. 1A is prepared. At part of the peripheral portion of the semiconductor substrate 21, there is formed an orientation flat OF that indicates crystal orientation. Over a substrate face 21a of the semiconductor substrate 21, semiconductor devices 24 (semiconductor elements) formed through a diffusion process and the like are aligned and disposed in a grid pattern.

In the substrate face 21a between the individual semiconductor devices 24, predetermined dividing lines DL1 to DL14 are established so that they extend toward a rear face (substrate face) 21b in the direction of the thickness of the semiconductor substrate 21. The predetermined dividing lines are lines along which the semiconductor substrate 21 is to be divided in the direction of its thickness. The predetermined dividing lines DL1 to DL7 are provided in the direction substantially perpendicular to the orientation flat OF so that they are parallel to one another. The predetermined dividing lines DL8 to DL14 are provided in the direction substantially parallel to the orientation flat OF so that they are parallel to one another. That is, the predetermined dividing lines DL1 to DL7 and the predetermined dividing lines DL8 to DL14 perpendicularly intersect each other.

Each semiconductor device 24 is encircled with predetermined dividing lines DL on its four sides. The semiconductor substrate 21 is divided along the predetermined dividing lines DL, and multiple semiconductor chips 22 each having a semiconductor device 24 are thereby obtained. Adjacent two of the semiconductor chips 22 are divided from each other on the predetermined dividing lines DL extending in the direction of thickness of the semiconductor substrate 21.

In the following description, portions that have not been divided from a semiconductor substrate 21 and are supposed to become semiconductor chips after the substrate is divided will also be referred to as semiconductor chips. These semiconductor chips 22 are formed by dividing a semiconductor substrate along predetermined dividing lines DL in the direction of its thickness in a dicing process. Thereafter, they are subjected to various processes, such as mount process, bonding process, and encapsulating process, and thereby brought to completion as packaged ICs and LSIs.

As illustrated in FIG. 1B, six semiconductor chips 22a to 22f are formed over the semiconductor substrate 21 along line IB-IB. To divide these semiconductor chips 22a to 22f from one another, seven predetermined dividing lines DL1 to DL7 and predetermined dividing lines DL11 and DL12 (FIG. 1A) that are not shown in FIG. 1B are established. Modified regions K (FIG. 3) that become starting points for division are formed on the predetermined dividing lines DL1 to DL7, DL11, and DL12 in the direction of the thickness of the semiconductor substrate 21 by the method described later.

Next, a sheet structure will be described.

Figure 2A:
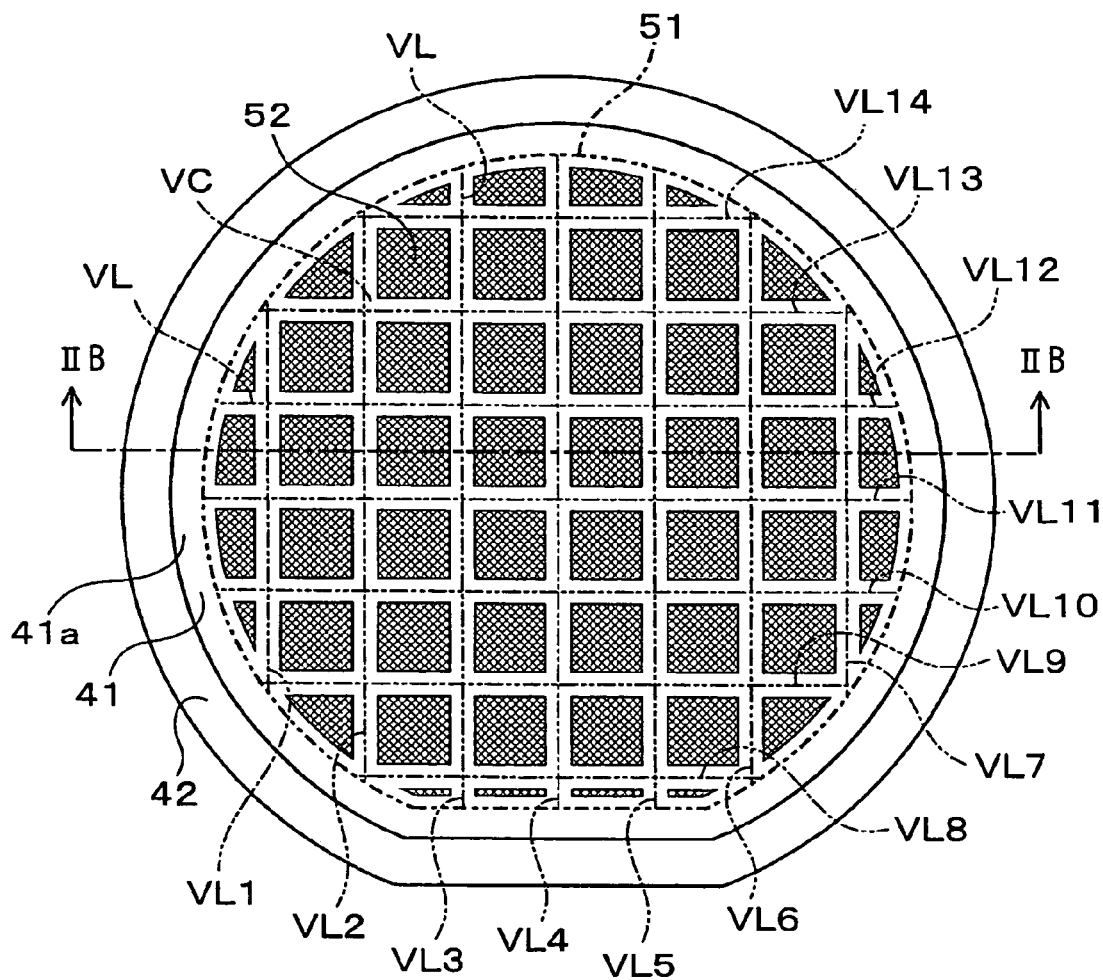
FIG. 2A is a plan view showing a sheet to which a semiconductor substrate is bonded and a frame that holds the sheet.
Figure 2B:
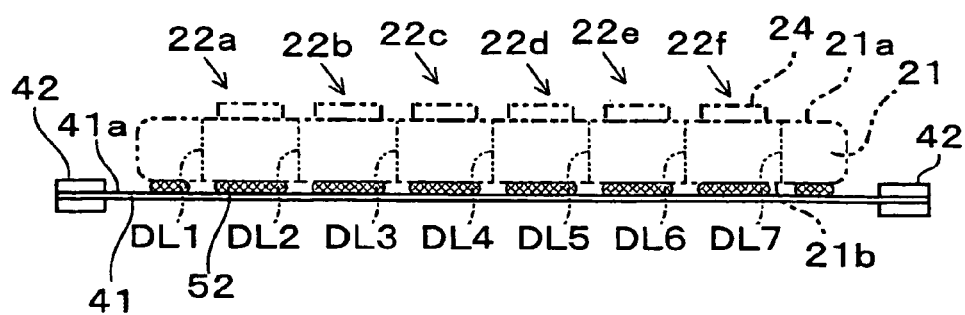
FIG. 2B is a schematic sectional view taken along line IIB-IIB of FIG. 2B, illustrating the semiconductor substrate bonded to the sheet.

FIG. 2A is a plan view showing an extensible resin sheet 41 to which the semiconductor substrate 21 is bonded and a frame 42 that holds the sheet 41, and FIG. 2B is a schematic sectional view taken along line IIB-IIB of FIG. 2B, illustrating the semiconductor substrate 21 bonded to the sheet 41. The extensible resin sheet 41 is for bonding a rear face 21b of the semiconductor substrate 21, opposite the substrate face 21a of the semiconductor substrate 21 (FIG. 1B). As illustrated in FIG. 2A, this sheet 41 has its peripheral portion supported by an annular frame 42 with tension applied to it.

In a joining face 41a of the sheet 41, that is bonded to the rear face 21b of the semiconductor substrate 21, there are established virtual lines VL1 to VL14 and regions VC encircled with the virtual lines VL1 to VL14. When the semiconductor substrate 21 is bonded to the positioning line 51 on the sheet 41 for placing the substrate in position, the virtual lines VL1 to VL14 correspond to the predetermined dividing lines DL1 to DL14 (FIG. 1A). Each region VC corresponds to each region on the rear face 21b of the semiconductor substrate 21 encircled with predetermined dividing lines DL. A segment of a bonding layer 52 composed of adhesive, such as ultraviolet curing adhesive, is formed in each region VC.

The segments of the bonding layer 52 are so formed that when the rear face 21b of the semiconductor substrate 21 and the joining face 41a of the sheet 41 are bonded to each other by pressing, they do not reach virtual lines VL set between adjoining regions VC.

In this example, each segment of the bonding layer 52 is formed substantially in the shape of rectangle in which each end of the segment of the bonding layer 52 is at a predetermined distance from the virtual lines VL encircling it.

The semiconductor substrate 21 is moved down from above the sheet 41 held by the frame 42 with the rear face 21b of the semiconductor substrate 21 kept parallel to the joining face 41a of the sheet 41. Then, the semiconductor substrate 21 is placed on the joining face 41a of the sheet 41 so that its circumference is aligned with the positioning line 51. The joining face 41a has the bonding layer 52 formed in advance. Therefore, the semiconductor substrate 21 and the sheet 41 can be easily bonded to each other just by placing the rear face 21b of the substrate on the joining face 41a of the sheet 41 and then pressing the semiconductor substrate 21.

When the rear face 21b of the semiconductor substrate 21 is pressed against the joining face 41a of the sheet 41, the segments of the bonding layer 52 are stretched in the direction of plane. However, the segments of the bonding layer 52 are so formed that they do not reach virtual lines VL set between adjoining regions VC after the pressing.

As illustrated in FIG. 2B, six semiconductor chips 22a to 22f are formed along the line IIB-IIB in the area of the semiconductor substrate 21 bonded to the sheet 41. Each segment of the bonding layer 52 bonds the rear face 21b of the semiconductor substrate 21 and the joining face 41a of the sheet 41 to each other. Even when it is stretched in the direction of plane, it does not reach predetermined dividing lines DL1 to DL7 because it is smaller in area than the bottom face of each of the semiconductor chips 22a to 22f.

That is, each segment of the bonding layer 52 is so formed that its area is smaller than that of each region VC. It is formed in such a size that the following is implemented: when the rear face 21b of the semiconductor substrate 21 is pressed against the joining face 41a of the sheet 41 to bond the substrate and the sheet to each other, sufficient adhesion is obtained; and even when the bonding layer 52 is expanded in the direction of plane, the segments of the bonding layer 52 do not reach virtual lines VL.

In other words, the distance between an end of a segment of the bonding layer 52 and an opposite virtual line VL is set such that: when the rear face 21b of the semiconductor substrate 21 is pressed against the joining face 41a of the sheet 41, the ends of segments of the bonding layer 52 expanded in the direction of plane do not reach virtual lines VL. The shape of the segments of the bonding layer 52 may be any other shape as long as the above-mentioned condition is satisfied. For example, they may be circular, or may be so formed that they are hollow and have a substantially rectangular outline. Or, small rectangular segments may be arranged in rows.

Next, a formation of a modified region (reformed region) due to laser light irradiation will be now described.

Figure 3:
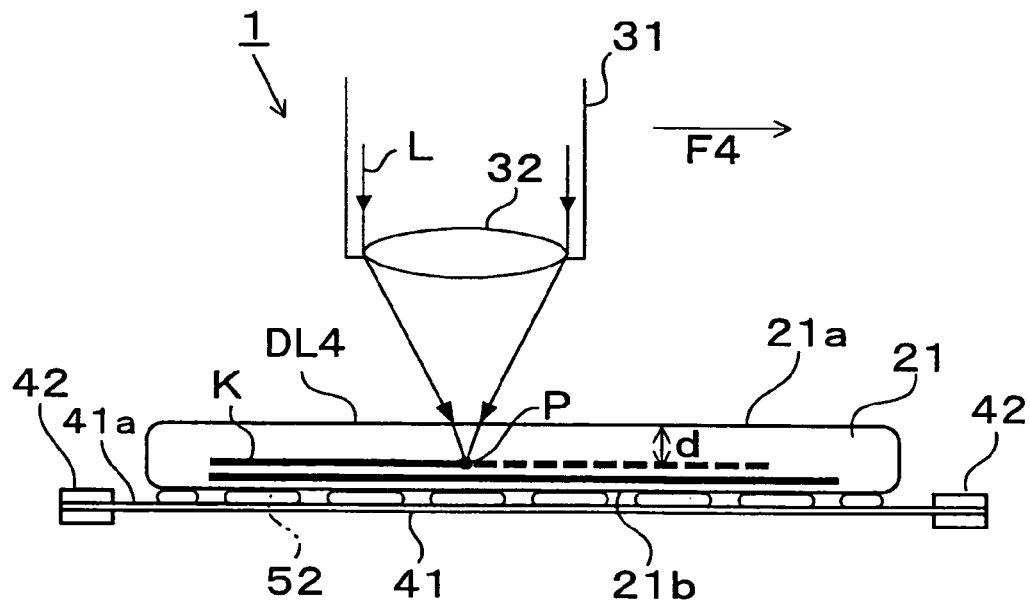
FIG. 3 is a schematic diagram illustrating a manufacturing equipment for manufacturing semiconductor chips, which is set so that a semiconductor substrate is irradiated with laser light.

FIG. 3 is a schematic diagram illustrating a manufacturing equipment 1 (manufacturing machine) for manufacturing semiconductor chips, which is set so that a semiconductor substrate is irradiated with laser light. As illustrated in FIG. 3, the manufacturing equipment 1 for forming semiconductor chips is provided with a laser head 31 that projects laser light L. The laser head 31 has a condenser lens 32 that converges the laser light L and is capable of converging the laser light L at a predetermined focal distance. In this example, the laser head is so set that the light-converging point P of the laser light L is formed at a place with a depth of d from the substrate face 21a of the semiconductor substrate 21.

To form a modified region K within a semiconductor substrate 21, one of the predetermined dividing lines DL illustrated in FIG. 1A is scanned with laser light for semiconductor substrate detection, and a range to be irradiated with laser light L is set. Here, description will be given with a case where modified regions K are formed on the predetermined dividing line DL4 taken as an example.

Subsequently, the laser head 31 is caused to make scanning movement along the predetermined dividing line DL4 (in the direction indicated by arrow F4 in the drawing), as illustrated in FIG. 3. While this is being done, laser light L is applied from the side of the substrate face 21a. As a result, a modified region K due to multiphoton absorption is appropriately formed in the pass at a depth of d through which the light-converging point P of the laser light L was caused to make scanning movement.

Multiphoton absorption is defined as a substance absorbing multiple homogeneous or heterogeneous photons. Because of this multiphoton absorption, a phenomenon designated as optical damage occurs at the light-converging point P and in the vicinity of the point within the semiconductor substrate W. This induces thermal distortion and cracks occur in that area. As a result, a layer in which cracks aggregate, that is, a modified region K is formed.

At this time, an arbitrary number of layers of modified region K can be formed at an arbitrary depth within the range of the thickness of the semiconductor substrate 21 by adjusting the depth d of the light-converging point P of the laser light L. In cases where a semiconductor substrate is relatively thick, for example, the light-converging point P is moved in the direction of its thickness, and a modified region K is formed continuously or at multiple points on the predetermined dividing line DL in the direction of the thickness of the substrate. Thus, the semiconductor substrate 21 can be divided without fail.

Also, with respect to the other predetermined dividing lines DL, a modified region K is formed as with the predetermined dividing line DL4.

In conventional cases where a modified region K is formed by applying laser light L, the following problem may arise when the bonding layer 52 is formed on the predetermined dividing line DL4. That is, when the light-converging point P of laser light L is positioned within the bonding layer 52 or in the immediate vicinity of the rear face 21b of the semiconductor substrate 21, the quality of the bonding layer 52 may be changed by heat affection in the conventional cases. For this reason, when the semiconductor substrate 21 is divided, powder from the modified bonding layer 52 can fly in all directions and stick to semiconductor devices 24 when the semiconductor substrate 21 is divided.

However, according to this embodiment, this problem does not arise. Even when laser light L is focused in the vicinity of the rear face 21b of the semiconductor substrate 21 along the predetermined dividing line DL4 for forming modified regions K, no bonding layer 52 exists on the predetermined dividing line DL4, as illustrated in FIG. 2B. Therefore, a modified portion is not formed in the bonding layer 52.

Next, a division of a semiconductor substrate 21 will be now described.

When stress is applied to the semiconductor substrate 21, cracks are thereby developed in the direction of the thickness of the substrate with the modified regions K taken as starting points. Thus, the semiconductor substrate 21 is divided along the predetermined dividing lines DL into the semiconductor chips. Here, the divided part for dividing the semiconductor substrate 21 extends in the direction of the thickness of the semiconductor substrate.

Figure 4A:
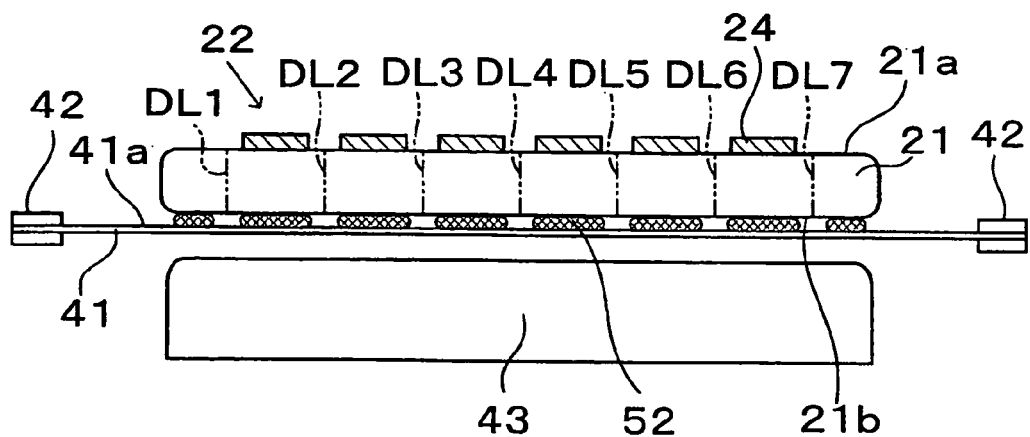
FIG. 4A is a schematic diagram illustrating a semiconductor substrate state before being divided.
Figure 4B:
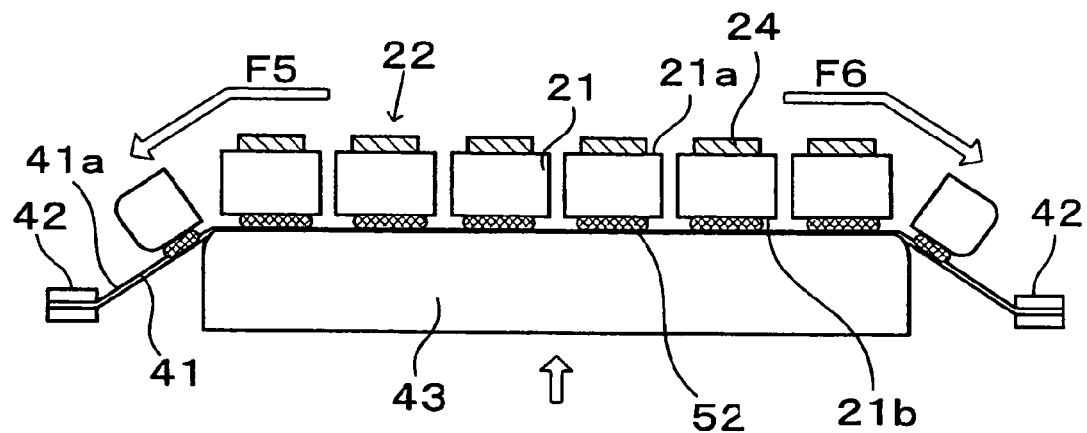
FIG. 4B is a schematic diagram illustrating a semiconductor substrate state after being divided.

FIG. 4A is a schematic diagram illustrating a semiconductor substrate state before being divided, and FIG. 4B is a schematic diagram illustrating a semiconductor substrate state after being divided. As illustrated in FIG. 4A, the frame 42 is fixed by a fixing means, not shown, with the semiconductor substrate 21 bonded to the sheet 41. The frame is fixed above a pushing machine 43 that is moved up/down by a moving member, not shown. The upper face of the pushing machine 43 is formed as a flat face whose size is substantially equal to the size of the rear face 21b of the semiconductor substrate 21.

As illustrated in FIG. 4B, the semiconductor substrate 21 is pushed from the rear side of the sheet 41 so that the substrate is plunged up. Thus, the upper face of the pushing machine 43 is abutted against the entire rear face 21b of the semiconductor substrate 21 with the sheet 41, and the sheet 41 is stretched in the direction of plane (in the directions indicated by arrows F5 and F6 in FIG. 4B.)

For this reason, tensile stress acts on the predetermined dividing lines DL1 to DL7 and the predetermined dividing lines DL11 and DL 12 (FIG. 1A), and cracks are developed with the modified regions K (FIG. 3) taken as starting points.

Therefore, the semiconductor substrate 21 is divided along the predetermined dividing lines DL1 to DL7 and the predetermined dividing lines DL11 and DL 12 into semiconductor chips 22a to 22f.

As mentioned above, the bonding layer 52 does not arrest and restrict the stretch of the sheet 41 in the vicinity of predetermined dividing lines DL. Therefore, stress for dividing the semiconductor substrate 21 into semiconductor chips 22 can be effectively applied to the predetermined dividing lines DL. As a result, the semiconductor substrate 21 can be divided into semiconductor chips 22 without fail, and the yield of the semiconductor chips 22 is enhanced. Since force required to expand the sheet 41 is reduced, there is no possibility that the bonding layer 52 is torn off or stripped off.

Further, since no bonding layer 52 exists on predetermined dividing lines DL, powder from the expanded bonding layer 52 does not fly or stick to the semiconductor devices 24 when the semiconductor substrate is divided.

Next, effects and advantages of the first embodiments will be now described.

In the first embodiment, the bonding layer 52 that bonds the rear face 21b of the semiconductor substrate 21 and the joining face 41a of the sheet 41 to each other is formed in the regions on the rear face 21b encircled with predetermined dividing lines DL. That is, the bonding layers 52 are formed between the rear face 21b of the semiconductor substrate 21 and the joining face 41a of the sheet 41, respectively inside the areas defined by the predetermined dividing lines DL, to respectively correspond to the semiconductor chips 22. At the same time, the bonding layer 52 is formed so that the rear face 21b and the joining face 41a of the sheet 41 are bonded to each other, while the bonding layer 52 does not reach the predetermined dividing lines DL formed between the above-mentioned regions adjoining to each other. For this reason, when the substrate face 21a of the semiconductor substrate 21 and the joining face 41a of the sheet 41 are bonded to each other, no bonding layer 52 exists on predetermined dividing lines DL set between the above-mentioned regions adjacent to each other. Therefore, the bonding layer 52 does not arrest and restrict the stretch of the sheet 41 in the vicinity of the predetermined dividing lines DL. As a result, the semiconductor substrate 21 can be divided into plural semiconductor chips 22 without fail, and the yield of the semiconductor chips 22 can be enhanced. Since force required to expand the sheet 41 is reduced, there is no possibility that the bonding layer 52 is torn off or stripped off. Further, since no bonding layer 52 exists on predetermined dividing lines DL, there is no possibility that powder from the bonding layer 52 expanded in conjunction with the expansion of the sheet 41 flies in all directions and sticks to the semiconductor devices 24 when the semiconductor substrate 21 is divided.

That is, according to a bonding method for the semiconductor substrate 21 and the sheet 41 in the first embodiment, the yield of the semiconductor chips 22 obtained by dividing the semiconductor substrate 21 can be enhanced, and powder caused from the bonding layer 52 can be prevented from sticking to semiconductor devices 24 when the semiconductor substrate 21 is divided.

Since the bonding layer 52 is formed on the joining face 41a of the sheet 41, the semiconductor substrate 21 and the sheet 41 can be easily bonded to each other just by placing the rear face 21b of the substrate 21 on the joining face 41a of the sheet 41 and then applying pressure.

Second Embodiment

Figure 5:
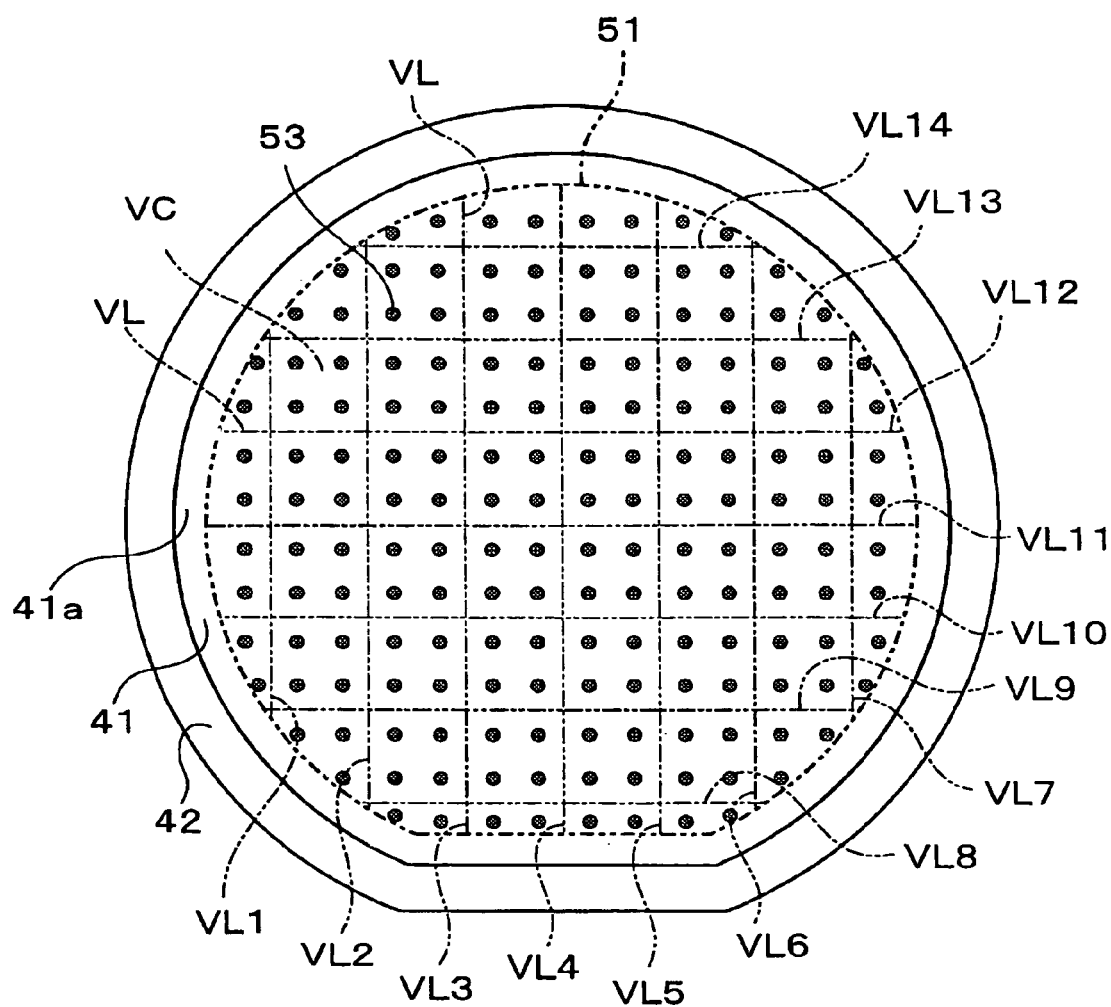
FIG. 5 is a schematic diagram illustrating an example of the configuration of a sheet used in a bonding method for a semiconductor substrate and a sheet according to a second embodiment.

An example of the second embodiment of the present invention will be now described with reference to FIG. 5. FIG. 5 is a schematic diagram illustrating a sheet example used in a bonding method for a semiconductor substrate 21 and a sheet 41 according to the second embodiment.

On a joining face 41a of the sheet 41, as illustrated in FIG. 5, segments of a bonding layer 53 formed in small, circular dot shape are provided at equal intervals on straight lines shifted from and parallel to virtual lines VL1 to VL14. Further, the segments of the bonding layer 53 are placed in the vicinity of the corners of each region VC at a rate of four segments to one region VC. That is, the segments of the bonding layer 53 are scattered between the rear face 21b of the semiconductor substrate 21 and the joining face 41a of the sheet 41, and bonds them to each other only at the point portions in the vicinity of the four corners of each face where a semiconductor chip 22 is bonded. Therefore, the semiconductor substrate 21 and the sheet 41 can be efficiently bonded to each other with a smaller quantity of the bonding layer 53. Since the portions in the vicinity of the corners of each semiconductor chip 22, where chipping is prone to occur, are bonded and arrested when the semiconductor substrate 21 is divided, chipping can be effectively reduced.

No bonding layer 53 is placed on the virtual lines VL in the example of FIG. 5. Therefore, when the rear face 21b (FIG. 1B) of the semiconductor substrate 21 is bonded to the joining face 41a of the sheet 41, no bonding layer exists on the predetermined dividing lines DL (FIG. 1A). Consequently, the bonding layer does not arrest and restrict the stretch of the sheet 41 in the vicinity of the predetermined dividing lines DL. For this reason, stress for dividing the semiconductor substrate 21 into semiconductor chips 22 can be effectively applied to the predetermined dividing lines DL. As a result, the semiconductor substrate 21 can be divided into semiconductor chips 22 without fail, and the yield of the semiconductor chips 22 is enhanced.

Since no bonding layer 53 exists on the predetermined dividing lines DL in the example of FIG. 5, there is no possibility that powder from the stretched bonding layer 53 flies in all directions and sticks to semiconductor devices 24.

The arrangement of the segments of the bonding layer 53 is not limited to the example illustrated in FIG. 5. The segments of the bonding layer 53 formed in dot shape may be arranged at higher density.

Figure 6:
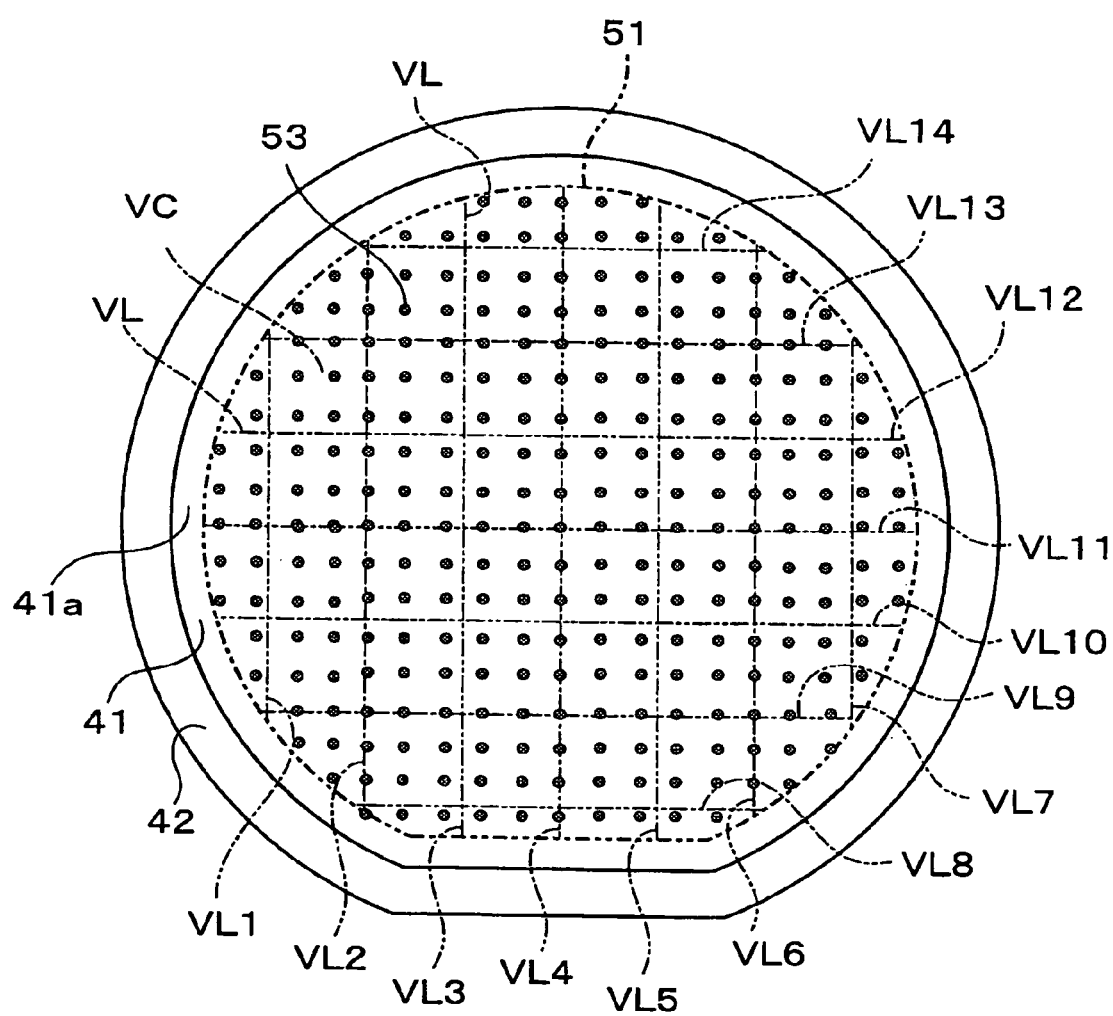
FIG. 6 is a schematic diagram illustrating a modification example of the second embodiment.

As illustrated in FIG. 6, for example, three rows of segments of the bonding layer 53 may be arranged per side of each region VC so that rows of segments of the bonding layer 53 are arranged in a grid pattern. In this construction, the segments of the bonding layer 53 are provided at relatively high density, so that force for bonding the rear face 21b of the semiconductor substrate 21 is increased. Therefore, stress for dividing the semiconductor substrate 21 by expansion of the sheet 41 can be more reliably applied to the predetermined dividing lines DL, and the semiconductor substrate 21 can be divided into semiconductor chips 22 without fail.

In the example shown in FIG. 6, a part of the bonding layer 53 exists on the predetermined dividing lines DL. However, since its quantity is smaller as compared with cases where the bonding layer is formed on the entire joining face 41a of the sheet 41, it does not arrest and restrict the stretch of the sheet 41 in the vicinity of the predetermined dividing lines DL.

Since force required to expand the sheet 41 is reduced, there is no possibility that the bonding layer 53 is torn off or stripped off. Further, when the semiconductor substrate 21 is divided, there is no possibility that powder from the bonding layer 53 flies in all directions and sticks to semiconductor devices 24. Furthermore, it can reduce the reformed part of the bonding layer 53 due to the affection of heat from laser light L on the predetermined dividing lines DL, thereby it can prevent powder caused from the bonding layer from sticking to semiconductor devices 24.

The segments of the bonding layer 53 shown in FIGS. 5 and 6 need not be linearly disposed. They may be concentrically disposed or may be dispersed at random without regularity. In any case, the segments of the bonding layer 53 is scattered between the rear face 21b of the semiconductor substrate 21 and the joining face 41a of the sheet 41; therefore, the probability of their existence on predetermined dividing lines DL is low, and the quantity of such segments, if any, is small. For this reason, the bonding layer does not arrest and restrict the stretch of the sheet 41 in the vicinity of predetermined dividing lines DL. Further, when the semiconductor substrate 21 is divided, there is no possibility that powder from the bonding layer 53 flies in all directions and stick to semiconductor devices 24.

In the examples of the second embodiment shown in FIGS. 5 and 6, the other parts may be formed similarly to those of the above-described first embodiment.

According to examples of the second embodiment, the following effects and advantages can be obtained.

In the second embodiment, the segments of the bonding layer 53 that bond the rear face 21b of the semiconductor substrate 21 and the joining face 41a of the sheet 41 to each other are scattered at points between the rear face 21b of the semiconductor substrate 21 and the joining face 41a of the sheet 41. This reduces the quantity of the segments of the bonding layer 53 existing on predetermined dividing lines DL. Therefore, there is substantially no influence of the bonding layer 53 arresting the stretch of the sheet 41 in the vicinity of the predetermined dividing lines DL. As a result, the semiconductor substrate 21 can be divided into semiconductor chips 22 without fail, and the yield of the semiconductor chips 22 can be enhanced. Further, since force required to expand the sheet 41 is reduced, there is no possibility that the bonding layer 53 is torn off or stripped off. Furthermore, there is no possibility that the following takes place: powder from the bonding layer 53 expanded in conjunction with the stretch of the sheet 41 flies in all directions and sticks to semiconductor devices 24 when the semiconductor substrate 21 is divided.

That is, according to a bonding method for bonding a semiconductor substrate 21 and a sheet 41 of the second embodiment, the yield of the semiconductor chips 22 obtained by dividing the semiconductor substrate 21 can be enhanced, and powder caused from the bonding layer 53 can be prevented from sticking to semiconductor devices 24 when the semiconductor substrate 21 is divided.

Since the segments of the bonding layer 53 are provided at points between the rear face 21b and the joining face 41a of the sheet 41, a quantity of adhesive or the like used for forming the bonding layer 53 can be effectively reduced.

Since the bonding layer 53 is formed on the joining face 41a of the sheet 41, the semiconductor substrate 21 and the sheet 41 can be easily bonded to each other just by placing the rear face 21b of the semiconductor substrate 21 on the sheet 41 and then applying pressure.

Even when a part of the bonding layer 53 exists on predetermined dividing lines DL, its quantity is smaller as compared with cases where the bonding layer is formed on the entire joining face 41a of the sheet 41. Therefore, the amount of the bonding layer 53 modified by the affection of heat from laser light L is very small, thereby effectively reducing powder flying to semiconductor devices 24.

Third Embodiment

Figure 7A:
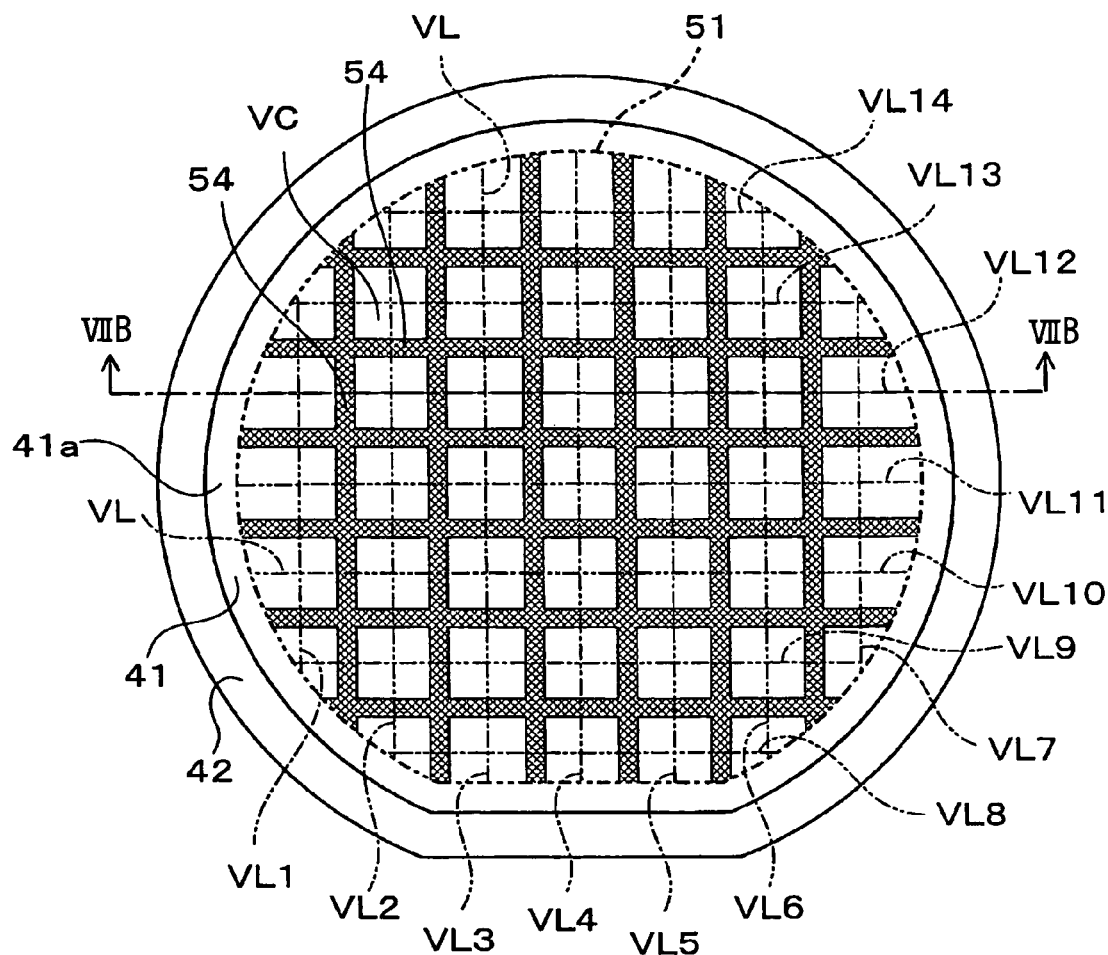
FIG. 7A is a plan view showing a sheet to which a semiconductor substrate is bonded and a frame that holds the sheet.

The third embodiment will be now described with reference to FIGS. 7A to 9. FIG. 7A is a plan view showing a sheet 41 to which a semiconductor substrate 21 is bonded and a frame 42 that holds the sheet 41, and FIG. 7B is a sectional view taken along line VIIB-VIIB of FIG. 7A, illustrating a semiconductor substrate state bonded to the sheet 41, on the virtual line VL12.

A bonding layer 54 is so constructed as illustrated in FIG. 7A. Strips of the bonding layer having a width equivalent to approximately 1/5 of the length of one side of the region VC are disposed in parallel to virtual lines VL along the joining face 41a of the sheet 41. The bonding layer is formed in the pattern of lattice in which the strips of the bonding layer 54 cross each other at right angles. The strips of the bonding layer 54 are so arranged that the spacing between bars of the lattice is substantially equal to the length of one side of each region VC and each intersection of the bars of the lattice is positioned in the center of each region VC. That is, there is not formed a portion where a strip of the bonding layer 54 that constitutes the lattice and a predetermined dividing line DL linearly overlap with each other.

With respect to each region VC, strips of the bonding layer 54 are formed in a crisscross pattern with their intersection positioned in the center of the joining face in the region VC. Therefore, the semiconductor substrate 21 can be firmly bonded so that stress is evenly applied to the individual semiconductor chips 22. Stress for dividing the semiconductor substrate 21 into semiconductor chips 22 can be applied to the predetermined dividing lines DL without fail. For this reason, the semiconductor substrate 21 can be divided into semiconductor chips 22 without fail.

Figure 7B:
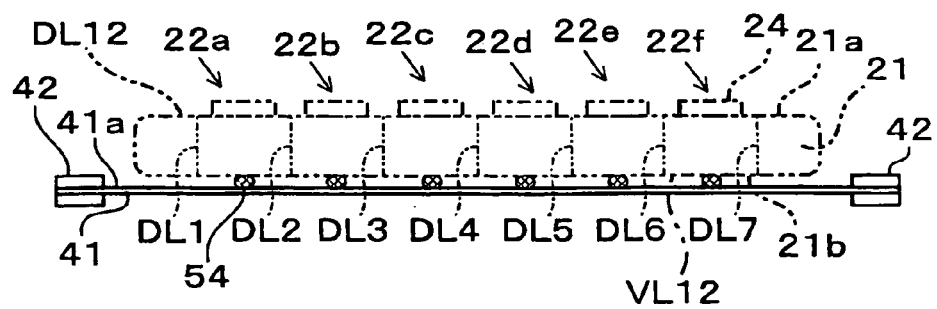
FIG. 7B is a sectional view taken along line VIIB-VIIB of FIG. 7A, illustrating a semiconductor substrate state bonded to the sheet, on virtual line VL12.

When the predetermined dividing line DL12 is taken as an example, the bonding layer 54 exists in the center between adjoining predetermined dividing lines DL1-DL7, as illustrated in FIG. 7B. For example, the bonding layer 54 exists in the center between the predetermined dividing line DL1 and the predetermined dividing line DL2. However, since its quantity is smaller as compared with cases where the substrate is bonded to the entire face of the sheet 41, the bonding layer does not arrest the stretch of the sheet 41 in the vicinity of the predetermined dividing line DL12. Further, since force required to expand the sheet 41 is reduced, there is no possibility that the bonding layer 54 is torn off or stripped off. Furthermore, there is no possibility that powder from the bonding layer 54 flies in all directions and sticks to semiconductor devices 24 when the semiconductor substrate 21 is divided.

Further, the semiconductor substrate 21 may be not irradiated with laser light L in regions where the bonding layer 54 is formed on a predetermined dividing line DL.

Figure 8:
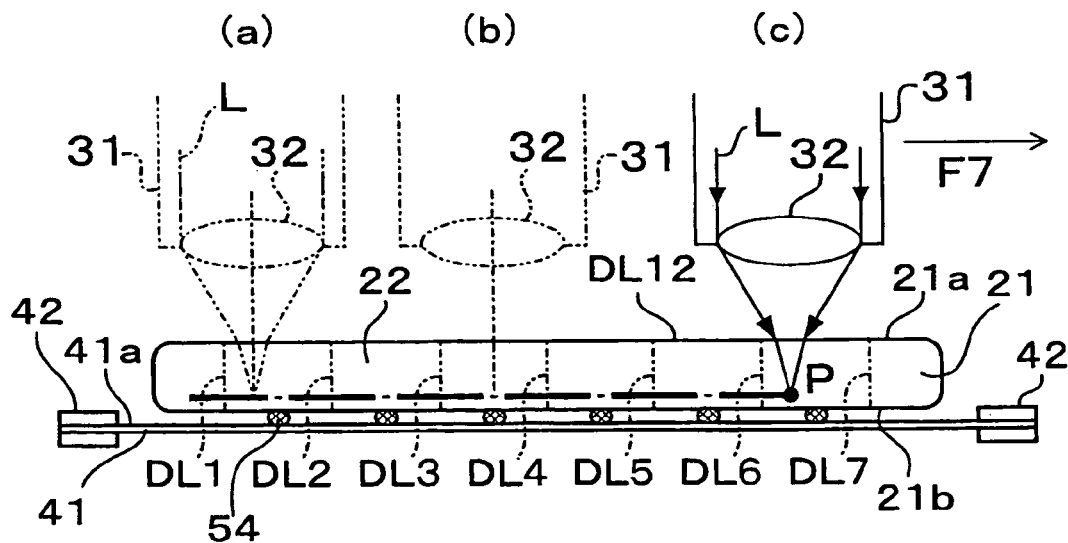
FIG. 8 is a schematic diagram illustrating a laser light irradiation method used in a bonding method for a semiconductor substrate and a sheet according to a third embodiment.

The laser head 31 is caused to make scanning movement along the predetermined dividing line DL12 in the direction indicated by the arrow F7 in FIG. 8, as illustrated in FIG. 8. Thus, the laser light L is applied to the semiconductor substrate 21, and the above-mentioned modified regions (reformed parts) are thereby formed within the substrate 21 in the direction of its thickness. In this case, irradiation with laser light L is stopped at portions where the bonding layer 54 exists. More specific description will be given. The semiconductor substrate 21 is irradiated with laser light L in regions where the bonding layer 54 is not formed, like the regions marked with (a) or (c). Irradiation with laser light L is stopped in areas where the bonding layer 54 is formed, like the region marked with (b). Thus, the bonding layer 54 can be completely prevented from being reformed and modified by the affection of heat from laser light L. As a result, there is no possibility that powder from the modified bonding layer 54 flies in all directions and sticks to semiconductor devices 24 when the semiconductor substrate 21 is divided.

This embodiment need not be constructed as illustrated in FIGS. 7A and 7B. For example, the spacing between bars of the lattice may be reduced, and the width of the strips of the bonding layer 54 may be arbitrarily set. The strips of the bonding layer 54 need not be in parallel to the virtual lines VL, and the strips of the bonding layer need not cross each other at right angles.

Figure 9:
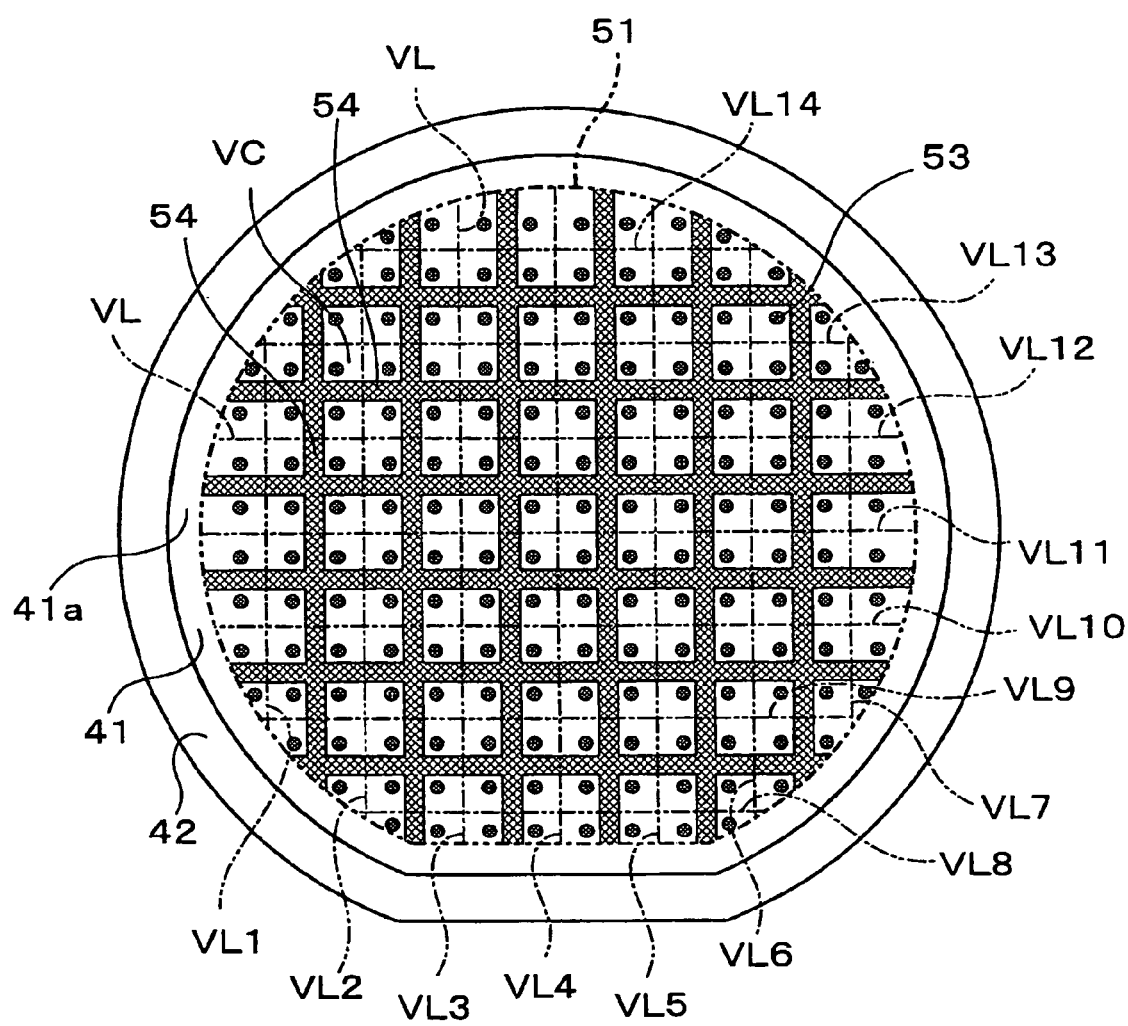
FIG. 9 is a schematic diagram illustrating a modification example of the third embodiment.

Further, as illustrated in FIG. 9, the strips of the bonding layer 54 may be arranged in combination with the dots of the bonding layer 53 described in the examples of the second embodiment. With this construction, stress can be effectively applied to the corners of semiconductor chips 22 where chipping is prone to occur, and the semiconductor substrate 21 can be more reliably divided.

According to the third embodiment, the bonding layer 54 that bonds the rear face 21b of the semiconductor substrate 21 and the joining face 41a of the sheet 41 to each other is formed in a lattice pattern. That is, the strips of the bonding layer 54 are formed between the rear face 21b of the semiconductor substrate 21 and the joining face 41a of the sheet 41 along the joining face 41a of the sheet 41 so that they intersect. At the same time, there is not formed a portion where a strip of the bonding layer 54 and a predetermined dividing line DL linearly overlap with each other. Therefore, the bonding layer 54 that exists on predetermined dividing lines DL can be reduced. For this reason, there is substantially no influence of the bonding layer 54 arresting the stretch of the sheet 41 in the vicinity of the predetermined dividing lines DL. As a result, the semiconductor substrate 21 can be divided into the semiconductor chips 22 without fail, and the yield of the semiconductor chips 22 can be enhanced. Further, since force required to expand the sheet 41 is reduced, there is no possibility that the bonding layer 54 is torn off or stripped off. Furthermore, there is little possibility that powder from the bonding layer 54 expanded in conjunction with the stretch of the sheet 41 flies in all directions and sticks to the semiconductor devices 24 when the semiconductor substrate 21 is divided.

According to a bonding method for bonding the semiconductor substrate 21 and the sheet 41 of the third embodiment, the yield of the semiconductor chips 22 obtained by dividing the semiconductor substrate 21 can be enhanced, and powder from the bonding layer 54 can be prevented from sticking to semiconductor devices 24 when the semiconductor substrate 21 is divided.

Since the bonding layer 54 is formed on the joining face 41a of the sheet 41, the semiconductor substrate 21 and the sheet 41 can be easily bonded to each other just by placing the rear face 21b of the substrate 21 on the joining face 41a of the sheet 41 and then applying pressure.

The quantity of the bonding layer 54 formed on predetermined dividing lines DL is smaller as compared with cases where the bonding layer is formed on the entire joining face 41a of the sheet 41. Therefore, the amount of the bonding layer 54 modified and reformed by the affection of heat from laser light L is very small, thereby reducing a powder amount flying from the modified bonding layer 54 in all directions and sticking to the semiconductor devices 24 when the semiconductor substrate 21 is divided.

In case such construction that the semiconductor substrate 21 is not irradiated with laser light L in the regions where the bonding layer 54 is formed on a predetermined dividing line DL is adopted, the bonding layer 54 can be prevented from being modified and reformed by the affection of heat from the laser light L applied to the predetermined dividing lines DL. Therefore, there is no possibility that powder from the modified bonding layer 54 flies in all directions and sticks to semiconductor devices 24 when the semiconductor substrate 21 is divided.

Other Embodiments

Although the present invention has been fully described in connection with the preferred embodiments thereof with reference to the accompanying drawings, it is to be noted that various changes and modifications will become apparent to those skilled in the art.

Figure 10:
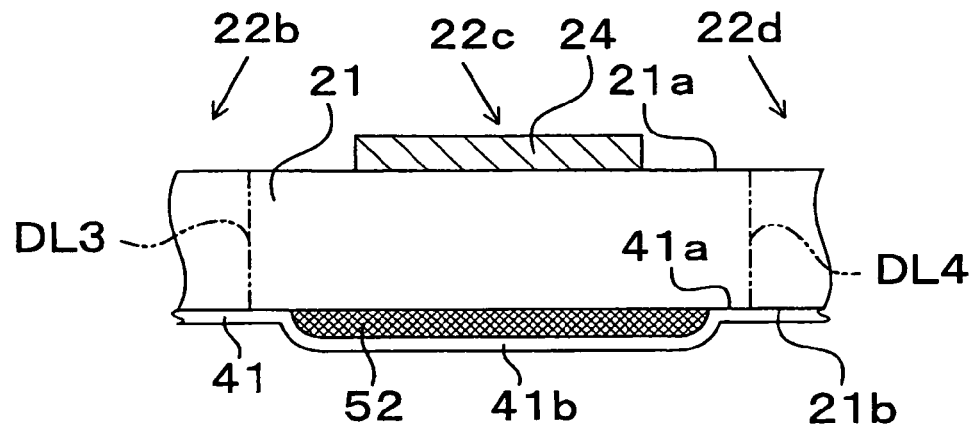
FIG. 10 is a schematic diagram illustrating a construction in which recessed portions recessed in the direction of the thickness of a sheet are formed in the joining face of the sheet and the bonding layer is formed in the recessed portions.

For example, recessed portions recessed in the direction of the thickness of the sheet 41 may be formed in the joining face 41a of the sheet 41. In this case, the bonding layer 52 in the first embodiment, the bonding layer 53 in the second embodiment, or the bonding layer 54 in the third embodiment may be located in the recessed portions. As an example, recessed portions 41b corresponding to the shape of the bonding layer 52 in the first embodiment are formed in the joining face 41a of the sheet 41 as in FIG. 10. The recessed portions 41b, substantially in rectangular shape, are recessed in the direction of the thickness of the bonding layer at positions corresponding to the segments of the bonding layer 52 in the first embodiment. The recessed portions are so formed that their volumetric capacity is larger than the quantity of each segment of the bonding layer 52. When the bonding layer 52 in the first embodiment is formed in these recessed portions 41b, the following advantages are brought. That is, when the rear face 21b of the semiconductor substrate 21 is bonded to the joining face 41a of the sheet 41, there is not have the following problems: the bonding layer 52 seeps out of the recessed portions 41b; extends in the direction of the plane of the semiconductor substrate 21; and reaches predetermined dividing lines DL3 and DL4.

As a result, the bonding layer 52 does not arrest and restrict the stretch of the sheet 41 in the vicinity of the predetermined dividing line DL3 or DL4. Therefore, the semiconductor substrate 21 can be divided into the semiconductor chips 22 without fail, and the yield of the semiconductor chips 22 can be enhanced. Further, there is no possibility that powder from the bonding layer 52 expanded in conjunction with the stretch of the sheet 41 flies in all directions and sticks to the semiconductor devices 24 when the semiconductor substrate 21 is divided.

Further, since the bonding layer 52 does not seep out of the recessed portions 41b, the expansion of the ends of the segments of the bonding layer 52 need not be taken into account. Therefore, the area of bonding can be increased. For example, it can be increased to a value equivalent to the spacing between predetermined dividing lines DL.

Alternatively, recessed portions 41b may be formed similarly to the arrangement of the bonding layer 53 formed as a pattern of dots or the bonding layer 54 formed in a lattice pattern, and the bonding layer 53 or the bonding layer 54 may be formed in these recessed portions 41b.

Figure 11:
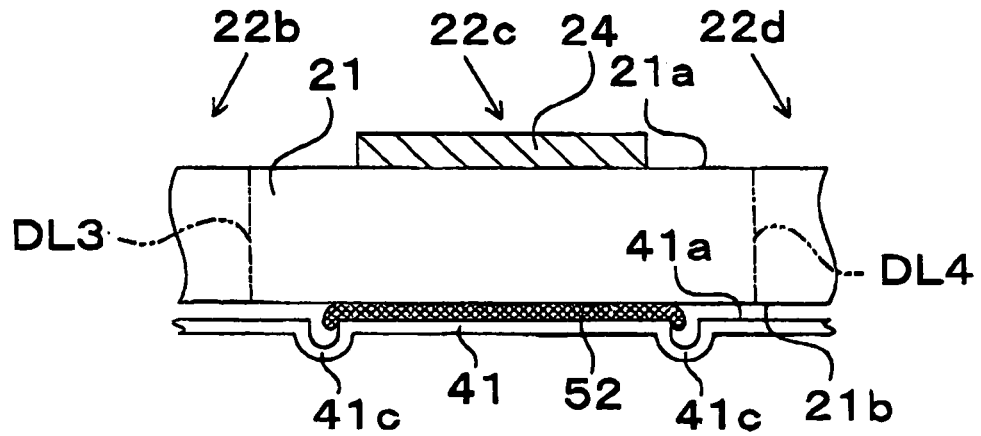
FIG. 11 is an explanatory drawing for explaining a construction in which recessed portions recessed in the direction of the thickness of a sheet are formed in the joining face of the sheet.

Furthermore, recessed portions recessed in the direction of the thickness of the sheet 41 may be formed in the joining face 41a of the sheet 41 such that, when the rear face 21b of the semiconductor substrate 21 and the joining face 41a of the sheet 41 are bonded to each other, the ends of segments of the bonding layer 52 get into the recessed portions, and the bonding layer 52 does not reach the predetermined dividing lines DL. For example, recessed portions 41c may be formed in the areas encircling the ends of segments of the bonding layer 52 along the bonding layer 52 in the first embodiment, as illustrated in FIG. 11. The recessed portions 41c may be formed as grooves that encircle the ends of segments of the bonding layer 52 in the first embodiment. The recessed portions 41c may be so formed that their volumetric capacity is larger than the amount of the segments of the bonding layer 52 extended when pressure is applied. In this case, when the rear face 21b of the semiconductor substrate 21 is bonded to the joining face 41a of the sheet 41: even when the segments of the bonding layer 52 are expanded in the direction of the plane of the semiconductor substrate 21, the expanded ends of the segments get into the recessed portions 41c, and the expansion is thereby absorbed by the recessed portions 41c. Therefore, it can prevent the bonding layer 52 from reaching the predetermined dividing lines DL3 and DL4.

As a result, the bonding layer 52 does not arrest and restrict the stretch of the sheet in the vicinity of the predetermined dividing line DL3 or DL4. Therefore the semiconductor substrate 21 can be divided into the semiconductor chips 22 without fail, and the yield of the semiconductor chips 22 can be enhanced. Further, there is no possibility that powder generated from the bonding layer 52 expanded in conjunction with the stretch of the sheet 41 flies in all directions and sticks to the semiconductor devices 24 when the semiconductor substrate 21 is divided.

The recessed portions may be so formed that their ends are positioned between the ends of segments of the bonding layer 52 and predetermined dividing lines DL.

Similarly to the example shown in FIG. 11, recessed portions may be concentrically formed at the peripheral portions of the segments of the bonding layer 53 formed in dot shape; or recessed portions may be formed along the peripheral portions of the segments of the bonding layer 54 formed in a lattice pattern.

The bonding layer 52, 53 or 54 may be formed on the rear face 21b of the semiconductor substrate 21. With this construction, the bonding layer 52, 53 or 54 can be accurately formed in position relative to predetermined dividing lines DL. Therefore, there is no possibility that a superfluous portion of the bonding layer 52, 53, or 54 exists on predetermined dividing lines DL due to displacement.

The bonding layer 52, 53 or 54 may be formed of a tape, such as double-face adhesive tape, that is capable of bonding.

When pressed, tapes are not expanded so much as adhesive. Therefore, the accuracy of position can be enhanced as compared with cases where the bonding layer 52, 53 or 54 is formed of adhesive. As a result, there is no possibility that a superfluous portion of the bonding layer 52, 53 or 54 exists on predetermined dividing lines DL because of displacement of the bonding layer 52, 53 or 54.

Figure 12:
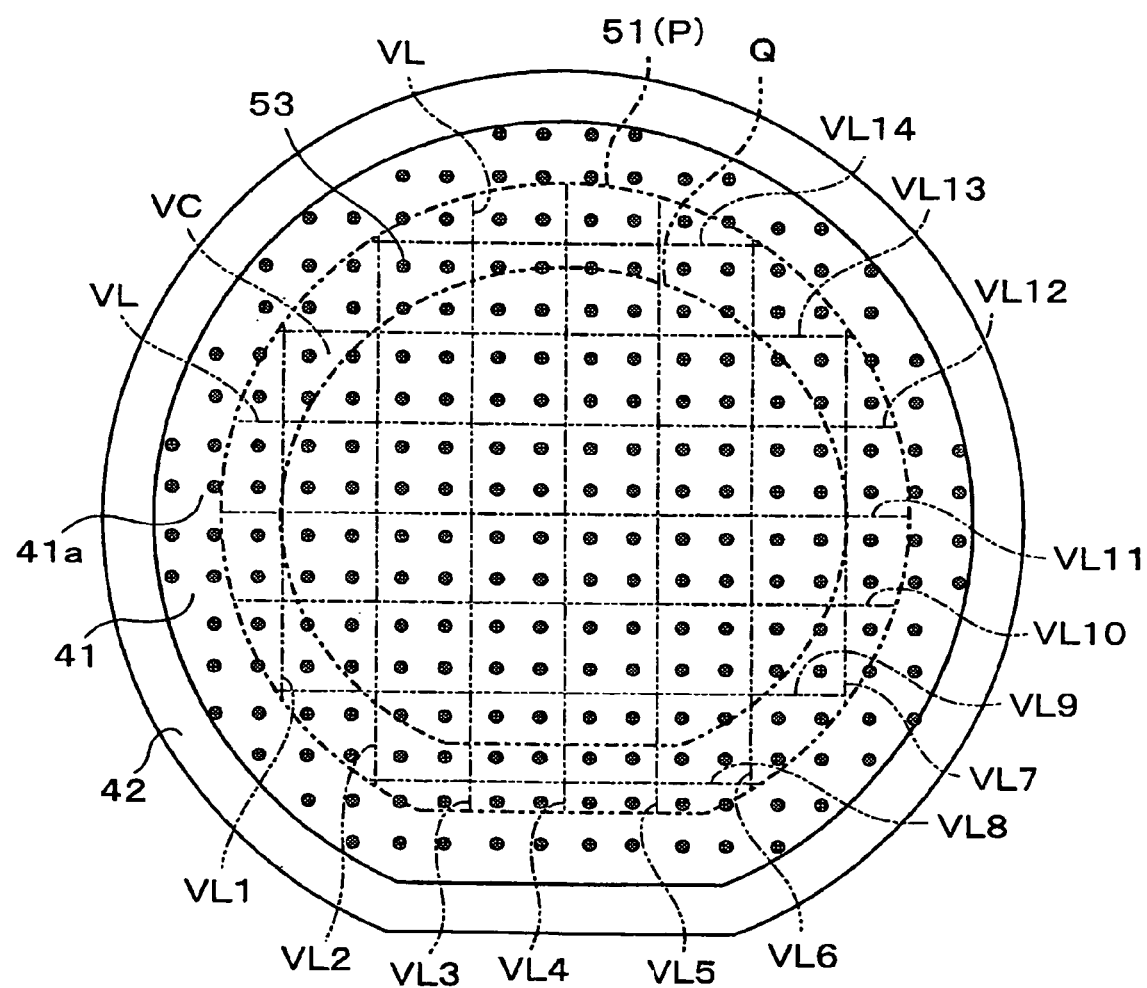
FIG. 12 is a schematic diagram illustrating a construction in which a bonding layer is formed over the entire face of a sheet.
Figure 13A:
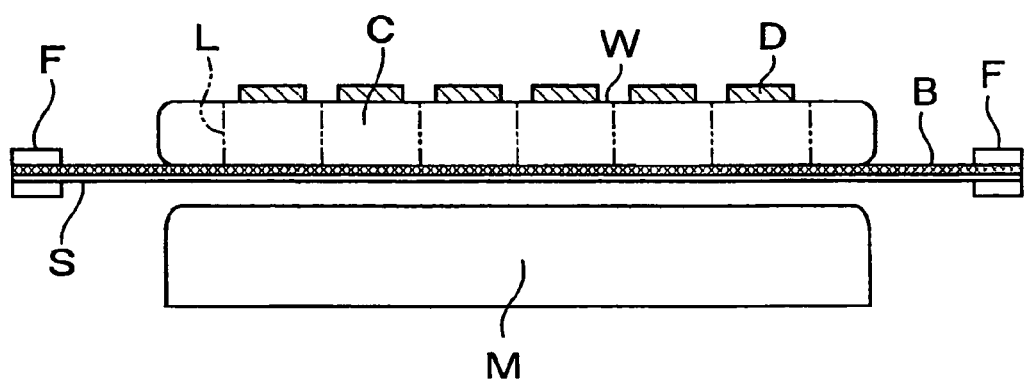
FIG. 13A is a schematic diagram illustrating a state in which a semiconductor substrate is bonded to a sheet and a peripheral portion of the sheet is supported by a frame.
Figure 13B:
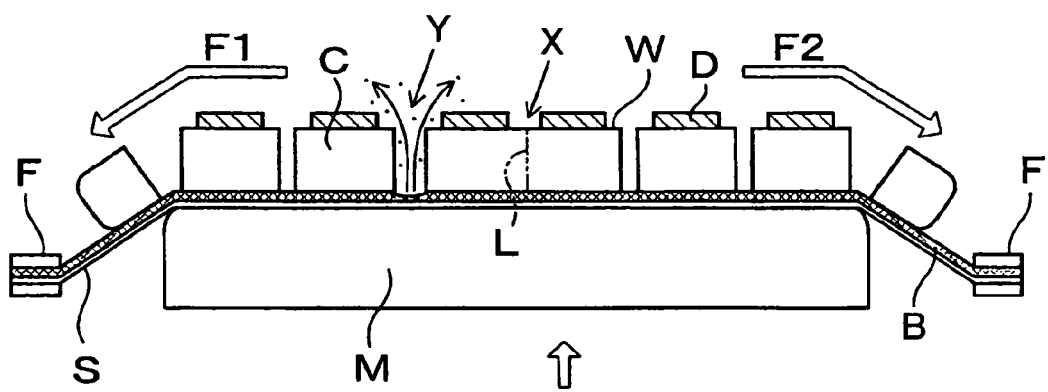
FIG. 13B is a schematic diagram illustrating a process in which the semiconductor substrate is divided into semiconductor chips with a pushing machine.

The bonding layer 52, 53 or 54 need not be formed inside the positioning line 51 for placing the semiconductor substrate 21 in position on the sheet 41. The bonding layer may be formed on the entire face of the sheet 41. For example, the bonding layer 53 may be formed on the entire face of the sheet 41, as illustrated in FIG. 12.

With this construction, a semiconductor substrate 21 having an outer circumference P and another semiconductor substrate 21 having an outer circumference Q different from the outer circumference P can be bonded with sheets 41 of the same configuration. That is, semiconductor substrates 21 different in outer circumference can be bonded with sheets 41 of the common configuration. Therefore, it is unnecessary to separately prepare dedicated sheets 41 having a bonding layer 53 formed to the dimensions of each semiconductor substrate 21.

The semiconductor substrate 21 need not be bonded to the center of the sheet 41. It can be bonded to the sheet 41 in any position as long as the predetermined dividing lines DL are precisely positioned relative to the bonding layer 53 before bonding the semiconductor substrate 21. Thus, multiple semiconductor substrates 21 may be bonded to one sheet 41, and they can be respectively divided into semiconductor chips by a single dividing operation.

Similarly, the bonding layer 52 or the bonding layer 54 may be formed on the entire face of the sheet 41. Also, in these cases, the above-mentioned effect can be obtained.

In the above embodiments, a semiconductor substrate formed only of silicon is used as the semiconductor substrate 21. The invention is not limited to these constructions, and can be applied to, for example, a semiconductor substrate 21 having an oxide film composed of oxide silicon formed over its substrate face 21*a* or a wafer of SOI (Silicon On Insulator).

Further, the invention can be applied to a semiconductor substrate composed of compound semiconductor, such as GaAs and SiC, or a ceramic substrate formed like a wafer.

Such changes and modifications are to be understood as being within the scope of the present invention as defined by the appended claims.

What is claimed is:

1. A manufacturing method of semiconductor chips, comprising:
    forming a bonding layer for bonding a substrate face of a semiconductor substrate and a joining face of a sheet to each other, at plural positions partially between the substrate face and the joining face of the sheet;
    moving a laser head that projects laser light along the predetermined dividing lines for dividing the semiconductor substrate, and applying the laser light from a side of the semiconductor substrate so that a light-converging point is positioned within the semiconductor substrate to form a modified region due to multiphoton absorption at the light-converging point; and
    expanding the sheet and thereby dividing the semiconductor substrate along predetermined dividing lines with the modified region taken as a starting point to form semiconductor chips,
    wherein at least one of the forming, the moving and the applying is performed such that the modified region is formed except for any of the predetermined dividing lines, and
    wherein the semiconductor substrate is not irradiated with the laser light in areas where the bonding layer is formed on the predetermined dividing lines.

2. The manufacturing method of claim 1,
    wherein the bonding layer is formed in each region encircled with the predetermined dividing lines, between the substrate face and the joining face of the sheet, and
    wherein the forming is performed such that, when the substrate face of the semiconductor substrate and the joining face of the sheet are bonded to each other, the bonding layer does not reach any of the predetermined dividing lines set between the regions.

3. The manufacturing method of claim 1, wherein
    the bonding layer is formed to form dotted segments scattered between the substrate face of the semiconductor substrate and the joining face of the sheet.

4. A manufacturing method of semiconductor chips, comprising:
    forming a bonding layer for bonding a substrate face of a semiconductor substrate and a joining face of a sheet to each other, at plural positions partially between the substrate face and the joining face of the sheet;
    moving a laser head that projects laser light along the predetermined dividing lines for dividing the semiconductor substrate, and applying the laser light from a side of the semiconductor substrate so that a light-converging point is positioned within the semiconductor substrate to form a modified region due to multiphoton absorption at the light-converging point; and
    expanding the sheet and thereby dividing the semiconductor substrate along predetermined dividing lines with the modified region taken as a starting point to form semiconductor chips,
    wherein at least one of the forming, the moving and the applying is performed such that the modified region is formed except for any of the predetermined dividing lines,
    wherein the semiconductor substrate is not irradiated with the laser light in areas where the bonding layer is formed on the predetermined dividing lines, and
    wherein the bonding layer is formed in a pattern of lattice in which strips intersect one another along the joining face of the sheet, except for portions where strips of the bonding layer and any of the predetermined dividing lines overlap with each other.

5. The manufacturing method of claim 1, further comprising
    forming recess portions recessed from the joining face of the sheet in the thickness direction of the semiconductor substrate,
    wherein the bonding layer is formed to have plural bonding parts, and
    wherein the bonding parts are formed respectively in the recess portion.

6. The manufacturing method of claim 5,
    wherein the recess portions are formed such that the bonding layer does not reach any of the predetermined dividing lines when the substrate face of the semiconductor substrate and the joining face of the sheet are bonded to each other.

7. The manufacturing method according to claim 1,
    wherein in the expanding, the semiconductor substrate is pushed via the sheet from a surface of the sheet opposite to the joining face toward the joining face by a pushing machine and the sheet is stretched in a direction parallel to a surface of the pushing machine.

8. The manufacturing method according to claim 1,
    wherein the sheet is made of an extensible material and is provided continuously.

9. The manufacturing method according to claim 1,
    wherein in the forming, the semiconductor substrate is arranged on the sheet via the bonding layer at the plural positions separate from each other.

10. The manufacturing method according to claim 1,
    wherein the sheet comprises on extendable resin material.

11. The manufacturing method according to claim 1, further comprising:
    forming a plurality of semiconductor devices on a first surface of the semiconductor substrate,
    wherein the bonding layer is bonded to a second surface of the semiconductor substrate, and
    wherein the second surface is opposite to the first surface.

12. The manufacturing method according to claim 1,
wherein the sheet is configured to be stretchable in an area opposite the modified region.

13. The manufacturing method according to claim 1,
wherein the modified region defines a rectangular shape.

14. The manufacturing method according to claim 13,
wherein the bonding layer comprises four dot-shaped bonding elements arranged in a vicinity of respective corners of the rectangular shape.

15. The manufacturing method according to claim 1,
wherein some of the plurality of positions of the bonding layer are arranged opposite the modified region.

16. The manufacturing method according to claim 1,
wherein the bonding layer comprises a plurality of dot-shaped bonding elements arranged at equal intervals on straight lines shifted from and parallel to the modified region.

17. The manufacturing method according to claim 1,
wherein the bonding layer is formed in a lattice pattern in which strips of the bonding layer cross each other at right angles.

18. A manufacturing method of semiconductor chips, comprising:
forming a bonding layer for bonding a substrate face of a semiconductor substrate and a joining face of a sheet to each other, at plural positions partially between the substrate face and the joining face of the sheet;
moving a laser head that projects laser light along the predetermined dividing lines for dividing the semiconductor substrate, and applying the laser light from a side of the semiconductor substrate so that a light-converging point is positioned within the semiconductor substrate to form a modified region due to multiphoton absorption at the light-converging point; and
expanding the sheet and thereby dividing the semiconductor substrate along predetermined dividing lines with the modified region taken as a starting point to form semiconductor chips,
wherein at least one of the forming, the moving and the applying is performed such that the modified region is formed except for any of the predetermined dividing lines,
wherein the semiconductor substrate is not irradiated with the laser light in areas where the bonding layer is formed on the predetermined dividing lines,
wherein the bonding layer is formed in a lattice pattern in which strips of the bonding layer cross each other at right angles,
wherein the modified region defines a rectangular shape, and
wherein an intersection of the strips of the bonding layer is formed proximate to a center of the rectangular shape.

19. The manufacturing method according to claim 1,
wherein the bonding layer comprise a plurality of bonding strips arranged in a lattice pattern, and a plurality of dot-shaped bonding elements.

* * * * *